United States Patent [19]

Stephan et al.

[11] Patent Number: 5,755,026
[45] Date of Patent: May 26, 1998

[54] METHOD OF PREVENTING CONDENSATION ON A SURFACE HOUSING AN ELECTRONIC APPARATUS

[75] Inventors: Frank Martin Stephan, Galveston; Donald Jay Mansmann, Carmel; Thurman R. Reed, Indianapolis, all of Ind.

[73] Assignee: Delco Electronics Corporation, Kokomo, Ind.

[21] Appl. No.: 698,078

[22] Filed: Aug. 15, 1996

[51] Int. Cl.$^6$ .................................................. H05K 3/02
[52] U.S. Cl. .................... 29/846; 29/825; 427/97
[58] Field of Search ........................... 29/825, 830, 846

[56] References Cited

U.S. PATENT DOCUMENTS

| | | |
|---|---|---|
| 3,725,215 | 4/1973 | Uchytil . |
| 3,796,843 | 3/1974 | Durkee et al. ............... 200/5 A |
| 3,909,504 | 9/1975 | Browne . |
| 4,188,977 | 2/1980 | Laakaniemi et al. ............ 137/833 |
| 4,650,974 | 3/1987 | Le Moine . |
| 4,677,529 | 6/1987 | Watababe et al. ............ 361/414 |
| 4,680,676 | 7/1987 | Petratos et al. ............ 361/424 |
| 4,695,926 | 9/1987 | McDermott . |
| 4,884,337 | 12/1989 | Choinski ............ 29/846 |
| 4,916,260 | 4/1990 | Broaddus et al. ............ 174/268 |
| 4,937,932 | 7/1990 | Ishii ............ 29/622 |
| 5,353,202 | 10/1994 | Ansell et al. ............ 361/818 |
| 5,392,197 | 2/1995 | Cuntz et al. ............ 361/818 |
| 5,434,749 | 7/1995 | Nakayama ............ 361/775 |

FOREIGN PATENT DOCUMENTS 0 546 211 B1  12/1991  European Pat. Off. .

*Primary Examiner*—Carl J. Arbes
*Attorney, Agent, or Firm*—Jimmy L. Funke

[57] ABSTRACT

Moisture condensed on a circuit board can cause dendritic growth which can short out a circuit. Such sensitive areas are protected from condensation by filling cavities in an assembly with insulating material to exclude moisture bearing air. Foamed plastic is molded or stamped into shapes which conform to a cavity and are inserted into the assembly. The plastic body is held against the circuit board to preclude condensation on the board. Adhesives and sealants are not required.

6 Claims, 1 Drawing Sheet

METHOD OF PREVENTING CONDENSATION ON A SURFACE HOUSING AN ELECTRONIC APPARATUS

FIELD OF THE INVENTION

This invention relates to protection of electronic assemblies and particularly to the prevention of condensation on moisture sensitive surfaces in such assemblies by the exclusion of air.

BACKGROUND OF THE INVENTION

Electrical circuits will not function as designed if shorting occurs across the circuits. Electrical circuits on printed circuit board are designed such that there is appropriate space or insulating material between components, component leads, traces, and solder pads to prevent shorting between circuits. However, shorting could still occur as a result of contaminants such as conductive particulates or dendritic growth between circuits. Conductive particles include metal shavings carried in by machined parts or created by applying screws to metal parts, solder balls and dropped screws and nuts.

Dendritic growth results from electrolysis. An ionic contaminant such as water on the circuit board allows the process of metal migration to occur through electrolysis. This process continues until there has been enough metal migration to create a dead short between two circuits. Typically high impedance circuits, and circuits very close in proximity are most susceptible to metal migration via electrolysis.

Because moisture can be a vehicle of electrolysis, condensation can be hazardous to printed circuit boards and their components. The circuit board needs to be protected from the environment (temperature and humidity) with some sort of enclosure. Typically such enclosures are in the form of some encapsulating material such as a waterproof flexible film, an acrylic coating, a hot melt polyolefin coating, a silicon coating, etc. The conformal coatings are usually permanent or semi-permanent. If board repair is required, solvents or special cleaning procedures are needed to remove the coating.

Conformal coat protection is generally applied at the circuit board assembly level of manufacturing, usually by a dipping, brushing, dispensing or spraying process. Special equipment is often required to apply the coating and to achieve proper coverage and repeatability. Repeatability of conformal coating coverage is a challenge. Usually some degree of automation is required to achieve repeatability in the material thickness and material location on the board, and labor is required as well.

The special equipment includes not only sprayers, dip tanks automatic brushes, and the like, but also apparatus to manage vapors emitted by the coating material. Such apparatus includes ventilation equipment for the plant and the operator, and air scrubbers and cleaners for the environment. Other special equipment are curing chambers, or ovens to cure the coatings.

Another concern is the protection of circuit elements from high temperatures due to heat sources near a heat sensitive component.

SUMMARY OF THE INVENTION

It is therefore an object of the invention to protect electronic apparatus from moisture while avoiding the special problems of applying conformal coating. Another object is to protect against moisture by means which is easily removed. Still another object is to protect electronic apparatus from heat as well as moisture.

Generally an electronic apparatus has a housing containing components, usually including a printed circuit board, and also including one or more cavities which typically comprise air spaces. Water vapor in air spaces within the housing can condense onto the circuit board or other component which is exposed to the air space. By inserting an insulating filler shaped like the cavity the air and the water vapor are excluded so that condensation will not occur. A tight seal is not required but only that a substantial air mass is not permitted. Since many areas in an assembly do not carry a circuit and are not harmed by moisture, it is not essential to fill all the cavities, but at least the region adjacent a sensitive surface is occupied by the filler so that even if condensation does occur within the assembly, it will not occur on the sensitive surface.

An insulating material such as a plastic foam is formed to the required shape in a mold or stamped from sheet stock in a manufacturing area separate from the assembly line, and is assembled in the housing along with the operating components.

BRIEF DESCRIPTION OF THE DRAWINGS

The above and other advantages of the invention will become more apparent from the following description taken in conjunction with the accompanying drawings wherein like references refer to like parts and wherein.

DESCRIPTION OF THE INVENTION

The ensuing description is directed to the protection of moisture sensitive surfaces of electronic components. Usually, a printed circuit board is the component to be protected but the invention applies to other components as well. In the context of this document, the term "moisture sensitive surface" means a surface containing conductors which may short out due to dendritic growth occurring as a result of ionically contaminated moisture.

Figure 1:
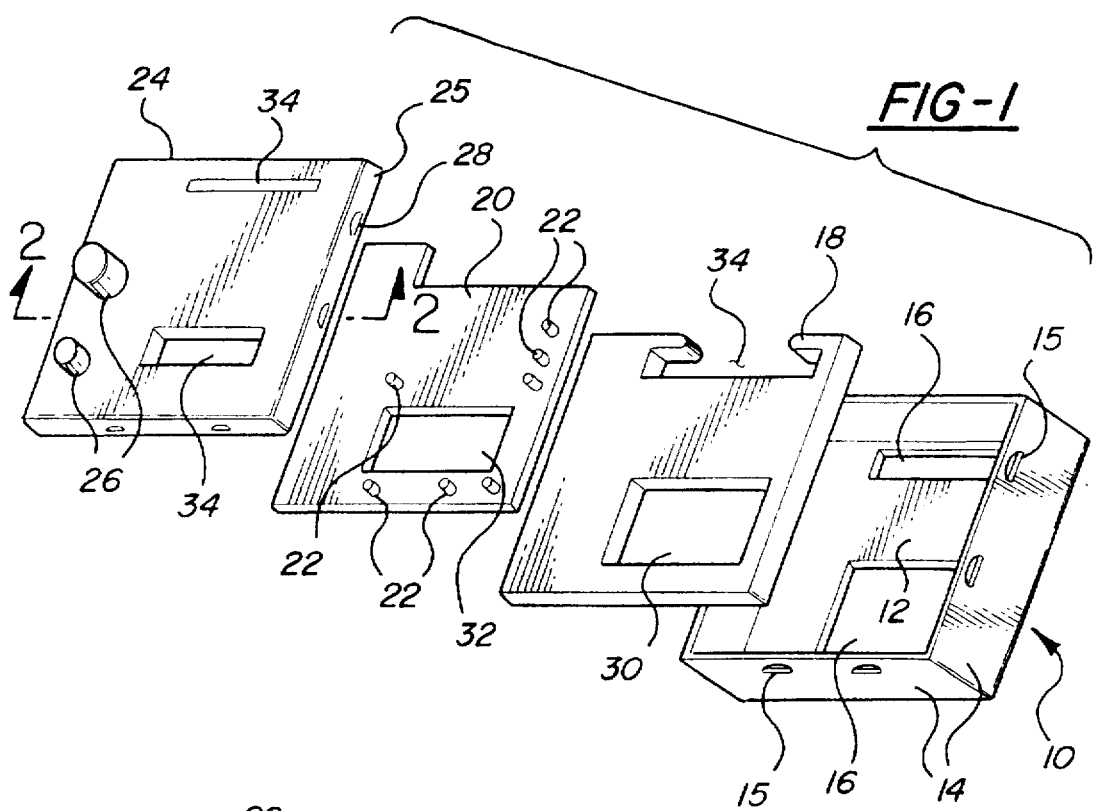
FIG. 1 is an exploded view of an electronic assembly containing an air exclusion body according to the invention.
Figure 2:
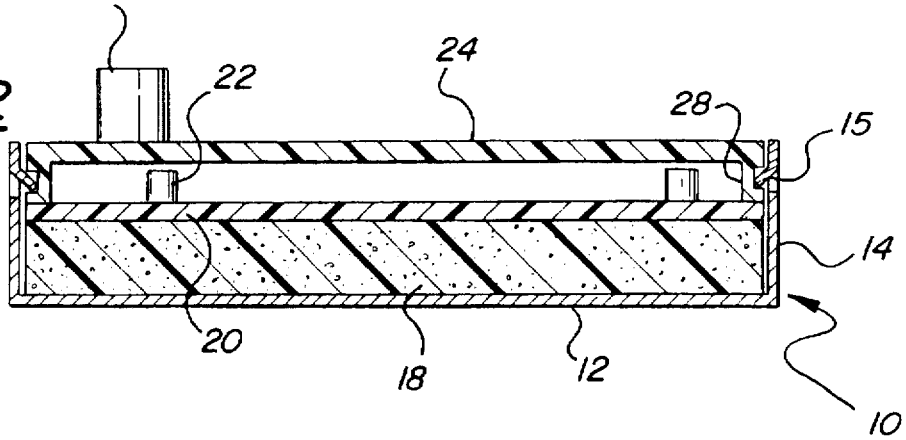
FIG. 2 is a cross-sectional view of the assembly of FIG. 1 taken along line 2—2.

Referring to FIGS. 1 and 2, a sheet metal housing 10 having a back panel 12, side walls 14 with indented tabs 15, and an open front. Openings 16 in the back panel are provided for access to subassemblies, not shown. The housing contains insulating body 18, a circuit board 20 carrying components 22, and a trim plate 24 having a flange 25 and control knobs 26. Detent depressions 28 on the flange 25 are engaged by the tabs 15 on the side walls, as seen in FIG. 2, to hold the assembly together with the body 18 in contact with the circuit board 20. The body 18, circuit board 20 and plate 24 have openings 30, 32 and 34, respectively, corresponding to the opening 16 in the back panel 12.

The insulating body 18 displaces any air which might otherwise reside between the circuit board 20 and the back panel 12, thus assuring that there will be no opportunity for condensation on any portion of the circuit board covered by the body 18. The body 18 is shaped so that all moisture sensitive (subject to dendritic growth) surfaces will be covered. It is preferred that the body be pressed close to the circuit board although a hermetic seal is not required. Where the body is a foam or other soft material, small projections such as the ends of component leads extending from the board may stick into the body and thus do not prevent contact between the board and the body.

The upper side of the circuit board 20 carrying components 22 is not moisture sensitive in this case and is not protected by an insulating body. Optionally, a second insulating body can be inserted between the circuit board and the trim plate 24 if required. That body can be provided with either apertures or recesses to accommodate the components 22; if the components need moisture protection then recesses are used to surround the components.

Figure 3:
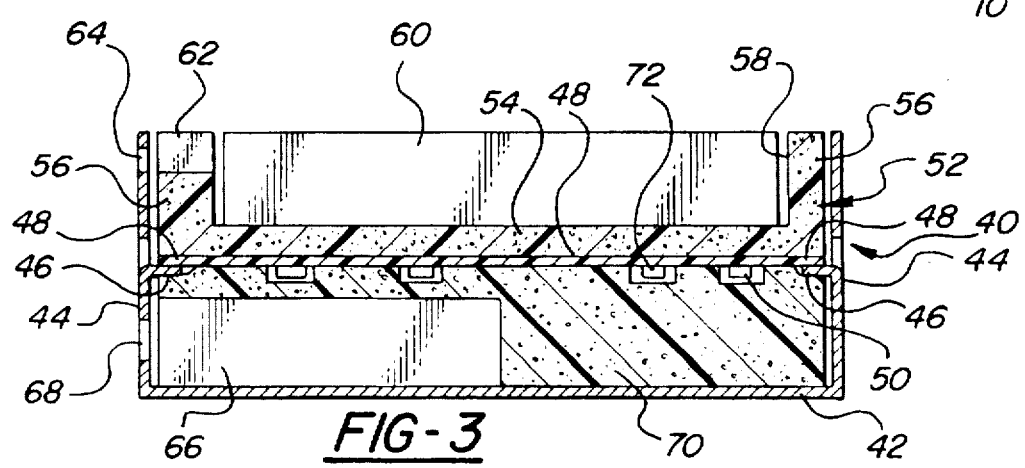
FIG. 3 is a cross-sectional view of an apparatus according to another embodiment of the invention.

In a second embodiment, shown in FIG. 3, a sheet metal housing 40 has a bottom panel 42 and side walls 44. Tabs 46 spaced from the bottom panel 42 are bent inward from the side walls to form supports for a circuit board 48. Components 50 are carried on the lower surface of the board 48. A premolded insulated body 52 has a flat bottom 54 resting on the upper surface of the board 48 and upper walls 56 along the housing side walls 44. The upper wall 56 and the bottom 54 define a cavity 58. A subassembly 60 nests in the cavity 58 and presses the body 52 against the circuit board 48. A relief portion 62 in an upper wall 56 allows access to the subassembly from an opening 64 in a side wall 44. A second subassembly 66 resides in the housing 40 below the circuit board 48 and is located adjacent another aperture 68 in a side wall 44. A second premolded insulated body 70 is shaped to fill the space below the circuit board 48 and engages the lower board surface. Recesses 72 are formed in the body 70 to accommodate the components 50. In this application the body 52 not only precludes air from the circuit board upper surface but substantially fills the region around the subassembly 60 as well.

Wherever the insulating body is used, it is made to conform in a form fitting manner to the protected unit. It contacts the circuit board on the entire surface or the sensitive region of the surface, or around the edges, or around the perimeter of the sensitive area. In addition to preventing condensation, it protects against conductive particle contamination due to stray pieces of metal associated with machined components in the assembly or due to the application of fasteners to the metal housing. No fasteners or other mounting hardware are required to install the insulating body. It is not required to seal the interface of the circuit board and body, and no sealant or adhesive is employed in the assembly. Moreover, no special measures are required to remove the body if the electronic apparatus is disassembled. In addition, it has been found that where a heat generating device is near a temperature sensitive component, the insulating body prevents the over-heating of the temperature sensitive component.

The insulating body 18 or 52 is molded to the desired size and shape or in the case of body 18 which has uniform thickness, the body is stamped from sheet stock of the correct thickness. The material may be a solid plastic although a foamed or expanded plastic is preferred. Expanded polypropylene has been successfully tested for this purpose; polyurethane is also acceptable. A wide range of densities is acceptable, but the material must be sufficiently dense to maintain its shape. For use in automotive environments the material should withstand temperatures from -50° C. to 100° C. Although polymers are usually preferred, another useful material for this purpose is cork which can be formed to the desired size and shape.

The successful use of foam plastic material in electronic apparatus has already been substantiated. As set forth in European Patent Specification 546,211, material such as expanded polypropylene molded to the proper shape can serve as the chassis of an electronic assembly, holding various parts in different recesses and providing air passages for cooling. There the properties of such material is set forth as: ease of molding, dimensional stability, resilience, a choice of densities, and light weight.

It will thus be seen that the heat and moisture protection while simplifying the circuit board manufacture. By eliminating traditional conformal coatings, the steps of application and curing the coating and the attendant equipment are eliminated along with the ventilation and air treatment requirements. This is replaced by molding equipment and processes which are less expensive and are not hazardous to the environment.

The embodiments of the invention in which an exclusive property or privilege is claimed are defined as follows:

1. A method of precluding condensation on a surface adjacent a cavity in an electronic apparatus comprising the steps of:

forming an insulating body to the shape of the cavity; then preventing condensation on the surface by inserting the body into the cavity adjacent the surface to thereby displace air from the cavity, to thereby preclude condensation; and enclosing the apparatus and the insulating body in a housing.

2. The invention as defined in claim 1 wherein the electronic apparatus includes a circuit board having a moisture sensitive surface and wherein:

the body is placed against the circuit board to inhibit moisture condensation on the moisture sensitive surface.

3. The invention as defined in claim 1 wherein the forming step comprises:

stamping the body from an insulating sheet of uniform thickness.

4. The invention as defined in claim 1 wherein the forming step comprises:

molding the body in a mold shaped substantially like the cavity.

5. The invention as defined in claim 1 wherein the insulating body comprises a foamed polymer.

6. The invention as defined in claim 1 wherein the insulating body comprises expanded polypropylene.

* * * * *